United States Patent
Kim et al.

(10) Patent No.: US 9,036,406 B2
(45) Date of Patent: May 19, 2015

(54) MAGNETO-RESISTIVE MEMORY DEVICE INCLUDING SOURCE LINE VOLTAGE GENERATOR

(71) Applicants: Hye-Jin Kim, Seoul (KR); Sang-Kyu Kang, Anyang-si (KR); Dong-Hyun Sohn, Hwaseong-si (KR); Dong-Min Kim, Seoul (KR); Kyu-Chan Lee, Seoul (KR)

(72) Inventors: Hye-Jin Kim, Seoul (KR); Sang-Kyu Kang, Anyang-si (KR); Dong-Hyun Sohn, Hwaseong-si (KR); Dong-Min Kim, Seoul (KR); Kyu-Chan Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 130 days.

(21) Appl. No.: 13/832,101

(22) Filed: Mar. 15, 2013

(65) Prior Publication Data
US 2013/0329489 A1 Dec. 12, 2013

(30) Foreign Application Priority Data
Jun. 12, 2012 (KR) .................. 10-2012-0062775

(51) Int. Cl.
G11C 11/00 (2006.01)
G11C 11/16 (2006.01)
G11C 5/14 (2006.01)

(52) U.S. Cl.
CPC ............ *G11C 11/1675* (2013.01); *G11C 5/147* (2013.01); *G11C 11/1697* (2013.01)

(58) Field of Classification Search
USPC .............. 365/51, 130, 148, 158, 229, 230.01, 365/230.03
See application file for complete search history.

(56) References Cited

U.S. PATENT DOCUMENTS

| | | | |
|---|---|---|---|
| 5,946,227 A | 8/1999 | Naji | |
| 6,418,046 B1 | 7/2002 | Naji | |
| 7,016,220 B2 | 3/2006 | Lee et al. | |
| 2002/0101760 A1 | 8/2002 | Naji | |
| 2003/0210600 A1* | 11/2003 | Koo et al. | 365/226 |
| 2008/0111605 A1* | 5/2008 | Yoshikawa et al. | 327/198 |
| 2010/0110775 A1* | 5/2010 | Yoon et al. | 365/158 |
| 2010/0195376 A1 | 8/2010 | Yoon et al. | |
| 2011/0267874 A1* | 11/2011 | Ryu et al. | 365/158 |
| 2011/0276817 A1 | 11/2011 | Fullerton et al. | |
| 2011/0301775 A1 | 12/2011 | Zhao | |
| 2012/0134217 A1* | 5/2012 | Fujisawa et al. | 365/189.05 |
| 2012/0182821 A1* | 7/2012 | Perego | 365/230.03 |
| 2013/0051134 A1* | 2/2013 | Kawahara et al. | 365/158 |
| 2013/0212431 A1* | 8/2013 | Ong | 714/15 |

FOREIGN PATENT DOCUMENTS

| | | |
|---|---|---|
| JP | 2008-294208 | 12/2008 |
| JP | 2009-049101 | 3/2009 |
| KR | 10-0592458 | 6/2006 |
| KR | 10-0919577 | 10/2009 |
| KR | 1020110018990 A | 2/2011 |
| KR | 1020110022088 | 3/2011 |
| WO | 2008/109768 A1 | 9/2008 |
| WO | 2009158274 A1 | 12/2009 |
| WO | WO2011135984 | * 11/2011 |

* cited by examiner

*Primary Examiner* — Fernando Hidalgo
(74) *Attorney, Agent, or Firm* — Volentine & Whitt, PLLC

(57) ABSTRACT

A MRAM includes a memory cell array of spin-transfer torque magnetic random access memory (STT-MRAM) cells and a source line commonly connected to the plurality of STT-MRAM cells. A source line voltage generator generates a source line driving voltage in response to an external power supply voltage and provides the source line driving voltage to the source line.

23 Claims, 17 Drawing Sheets

MAGNETO-RESISTIVE MEMORY DEVICE INCLUDING SOURCE LINE VOLTAGE GENERATOR

CROSS-REFERENCE TO RELATED APPLICATION

This application claims priority under 35 U.S.C. §119 to Korean Patent Application No. 10-2012-0062775 filed on Jun. 12, 2012, the disclosure of which is hereby incorporated by reference in its entirety.

BACKGROUND

Embodiments of the inventive concept relate to nonvolatile memory devices, and more particularly, to magneto-resistive random access memory devices (MRAM) incorporating spin-transfer torque (STT) type MRAM cells or STT-MRAM cells.

The design and development of contemporary semiconductor devices are characterized by continuing demands for increased memory cell integration density (i.e., number of memory cells per arbitrary unit of area), greater data storage capacity, and increased data processing speed and bandwidth. The magneto-resistive random access memory (MRAM) is well aligned to these demands. MRAM store data according to two or more resistive states associated with a resistive element in each MRAM cell. Different resistive states may be defined for the resistive element (e.g., a magnetic body) of a MRAM cell by controlling its magnetic polarity.

More recently, the need for small, reliable, low-power consumption nonvolatile memory devices in certain mobile devices has been particularly acute. Accordingly, research is ongoing into approaches whereby MRAM may be used in mobile device applications that require high processing data speed and low power consumption.

SUMMARY

Embodiments of the inventive concept provide a magneto-resistive random access memory (MRAM) device including a source line voltage generator disposed in a memory chip, as well as memory systems including this type of MRAM.

In one embodiment, the inventive concept provides a magneto-resistive random access memory (MRAM) device comprising; a memory cell array including a plurality of spin-transfer torque magnetic random access memory (STT-MRAM) cells and a source line commonly connected to the plurality of STT-MRAM cells, the memory cell array being configured to operate in response to a word line driving signal and a column selection signal, an address input buffer configured to generate a row address and a column address based on an external address, a row decoder configured to decode the row address and generate the word line driving signal based on the decoded row address, a column decoder configured to decode the column address and generate the column selection signal based on the decoded column address, and a source line voltage generator configured to generate a source line driving voltage in response to an external power supply voltage and provide the source line driving voltage to the source line.

In another embodiment, the inventive concept provides a magneto-resistive random access memory (MRAM) device comprising; a memory cell array including a plurality of spin-torque transfer magnetic random access memory (STT-MRAM) cells commonly connected to a source line, wherein the memory cell array is laid out on a substrate in a plurality of banks, and each one of the plurality of STT-MRAM cells is configured to operate in response to a word line driving signal and a column selection signal, a row decoder configured to decode a row address and generate the word line driving signal based on the decoded row address, a column decoder configured to decode a column address and generate the column selection signal based on the decoded column address, and a source line voltage generator configured to supply a source line driving voltage to the source line.

In another embodiment, the inventive concept provides a memory system comprising; a memory controller configured to generate an address and control signals controlling operation of a magneto-resistive random access memory (MRAM) device, wherein the MRAM comprises, a memory cell array including a plurality of spin-transfer torque magnetic random access memory (STT-MRAM) cells and a source line commonly connected to the plurality of STT-MRAM cells, the memory cell array being configured to operate in response to a word line driving signal and a column selection signal, an address input buffer configured to generate a row address and a column address based on an external address, a row decoder configured to decode the row address and generate the word line driving signal based on the decoded row address, a column decoder configured to decode the column address and generate the column selection signal based on the decoded column address, and a source line voltage generator configured to generate a source line driving voltage in response to an external power supply voltage and provide the source line driving voltage to the source line.

BRIEF DESCRIPTION OF THE DRAWINGS

The foregoing and other features and advantages of the inventive concept will be apparent to those of ordinary skill in the art upon consideration of certain embodiments of the inventive concept illustrated in the accompanying drawings. In the drawings.

DETAILED DESCRIPTION

Certain embodiments of the inventive concept will now be described in some additional detail with reference to the accompanying drawings. However, it is important to understand that the inventive concept may be embodied in many different forms and should not be construed as being limited to only the illustrated embodiments. Throughout the drawings and written description, similar elements and features are denoted with like reference numbers and labels.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concept.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
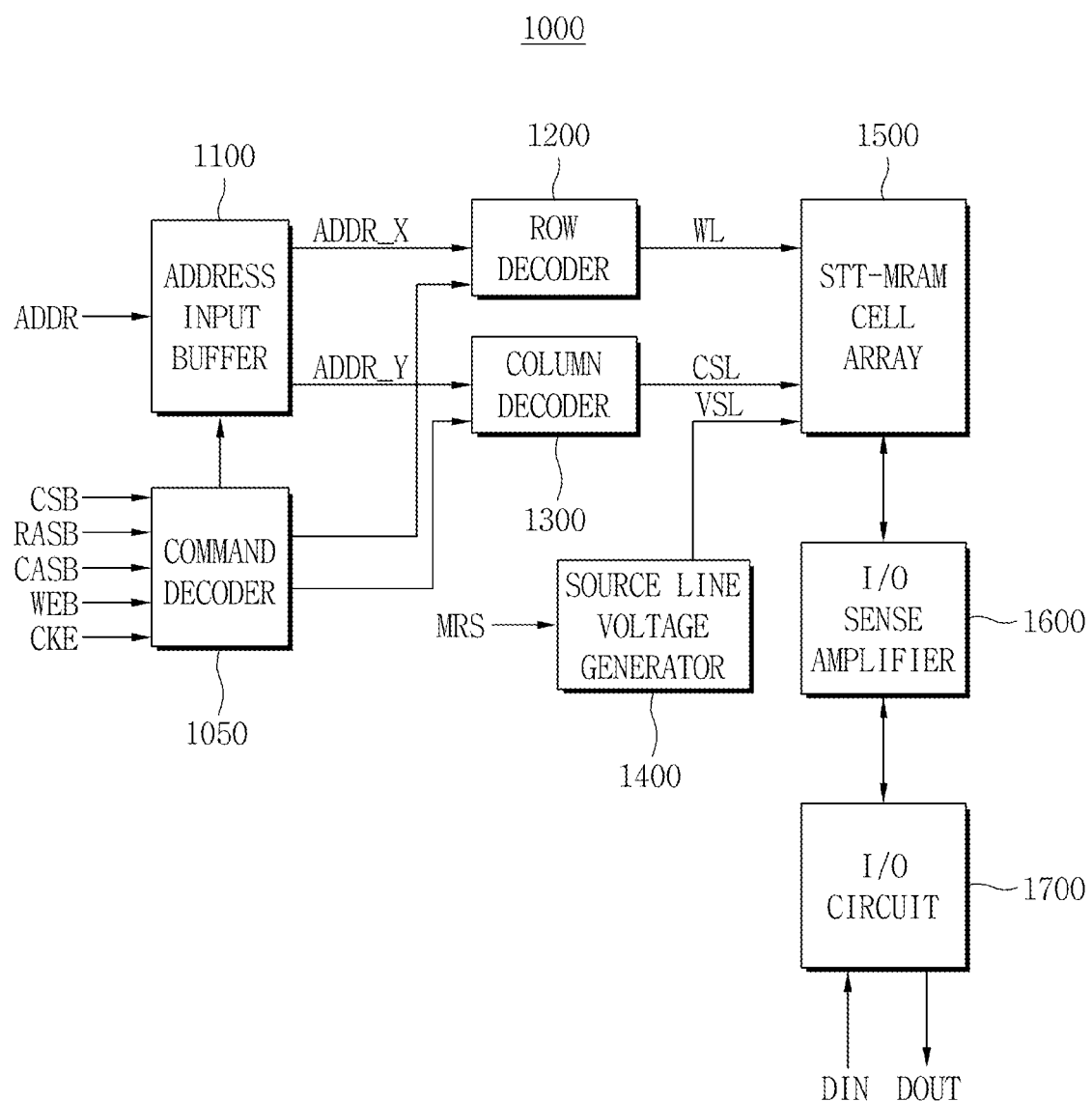
FIG. 1 is a block diagram of a magneto-resistive random access memory (MRAM) device according to an embodiment of the inventive concept.

Figure (FIG. 1 is a block diagram of a magneto-resistive random access memory (MRAM) device 1000 according to an embodiment of the inventive concept.

Referring to FIG. 1, the MRAM device 1000 comprises a command decoder 1050, an address input buffer 1100, a row decoder 1200, a column decoder 1300, a source line voltage generator 1400, a memory cell array 1500, an input/output (I/O) sense amplifier 1600, and an I/O circuit 1700.

The command decoder 1050 may decode a chip selection signal CSB, a row address strobe signal RASB, a column address strobe signal CASB, a write enable signal WEB, and a clock enable signal CKE, generate various control signals, and control circuit blocks disposed in the MRAM device 1000.

The memory cell array 1500 includes a plurality of spin-transfer torque magnetic random access memory (STT-MRAM) cells and operate in response to a word line driving signal WL and a column selection signal CSL. The address input buffer 1100 may be used to generate a row address ADDR_X and a column address ADDR_Y based on an external address ADDR. The row decoder 1200 may decode the row address ADDR_X, generate the decoded row address, and generate the word line driving signal WL. The column decoder 1300 may be used to decode the column address ADDR_Y, generate the decoded column address, and generate the column selection signal CSL based on the decoded column address.

The source line voltage generator 1400 may be used to generate a source line driving voltage VSL based on an external power supply voltage, and provide the source line driving voltage VSL to a source line of the memory cell array 1500. As described in some additional detail hereafter, certain (or all) of the circuit blocks implementing the source line voltage generator 1400 may be disabled during a standby mode or a power-down mode for the constituent memory system. For example, some or all of the circuit blocks implementing the source line voltage generator 1400 may disabled in response to a mode register set (MRS) signal.

The I/O sense amplifier 1600 may be sued to amplify data output by the memory cell array 1500, generate first data, and transmit input data DIN to the memory cell array 1500. The I/O circuit 1700 may be used to determine the order of output of the first data, perform a parallel/serial conversion, generate output data DOUT, buffer input data DIN, and provide the buffered input data DIN to the I/O sense amplifier 1600.

Figure 2:
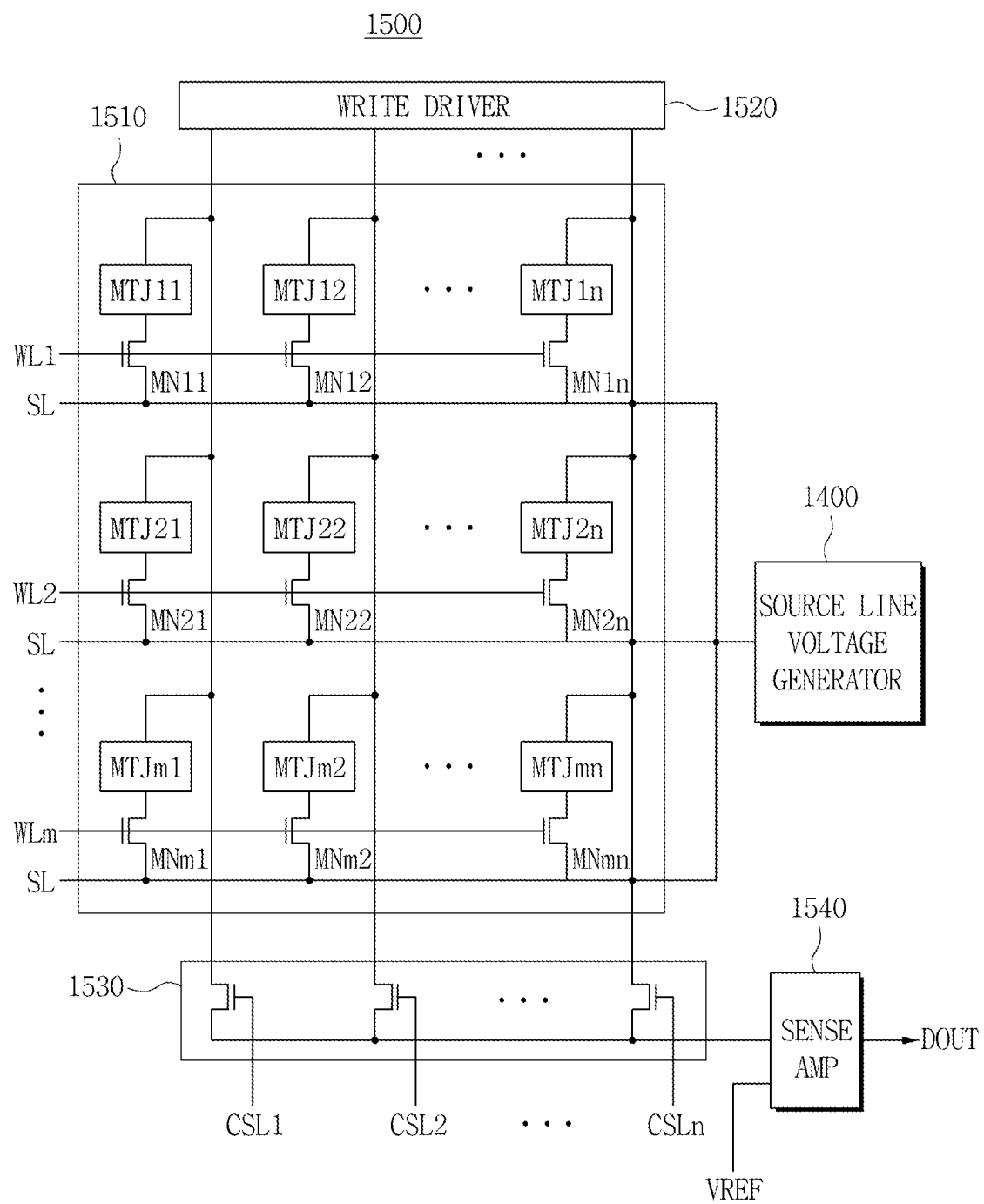
FIG. 2 is a circuit diagram of an example of a memory cell array included in the MRAM device of FIG. 1.

FIG. 2 is a circuit diagram further illustrating the memory cell array 1500 included in the MRAM device 1000 of FIG. 1.

Referring to FIG. 2, the memory cell array 1500 comprises a memory cell array unit 1510, a write driver 1520, a selection circuit 1530, and a sense amplifier 1540. As shown in FIG. 2, the memory cell array unit 1510 may be connected to the source line voltage generator 1400.

The memory cell array unit 1510 will generally include a plurality of word lines WL1 to WLm and a plurality of bit lines BL1 to BLn, and a unit memory cell may be provided between each of the word lines WL1 to WLm and the corresponding one of the bit lines BL1 to BLn. The selection circuit 1530 may be used to selectively connect the bit lines BL1 to BLn to the sense amplifier 1540 in response to column selection signals CSL1 to CSLn. The sense amplifier 1540 may be used to amplify a difference between an output voltage signal of the selection circuit 1530 and a reference voltage VREF, and generate output data DOUT. As will be further described with reference to FIGS. 13, 14 and 15 a write driver 1430 may be connected to the bit lines BL1 to BLn and used to generate a program current based on write data and then selectively provide the generated program current to the bit lines BL1 to BLn. To magnetize a magnetic tunnel junction (MTJ) element disposed in the memory cell array 1510, a voltage higher than a voltage applied to the bit lines BL1 to BLn must be applied to a source line SL. The source line voltage generator 1400 may be used to generate a source line driving voltage VSL, and provide the source line driving voltage VSL to the respective source lines of the memory cell array unit 1510.

The memory cell array unit 1510 is assumed to include cell transistors MN11 to MN1n having gates connected to the word line WL1 and MTJ elements MTJ11 to MTJ1n respectively connected between the cell transistors MN11 to MN1n and the bit lines BL1 to BLn. The sources of the cell transistors MN11 to MN1n are connected to a source line SL. The memory cell array unit 1510 is further assumed to include cell transistors MN21 to MN2n having gates connected to a word line WL2 and MTJ elements MTJ21 to MTJ2n respectively connected between the cell transistors MN21 to MN2n and the bit lines BL1 to BLn. The sources of the cell transistors MN21 to MN2n are connected to a source line SL. Finally, as specifically illustrated in the example of FIG. 2, the memory cell array unit 1510 is assumed to include cell transistors MNm1 to MNmn having gates connected to a word line WLm and MTJ elements MTJm1 to MTJmn respectively connected between the cell transistors MNm1 to MNmn and the bit lines BL1 to BLn. Here again, the sources of the cell transistors MNm1 to MNmn are connected to a source line SL.

Figure 3:
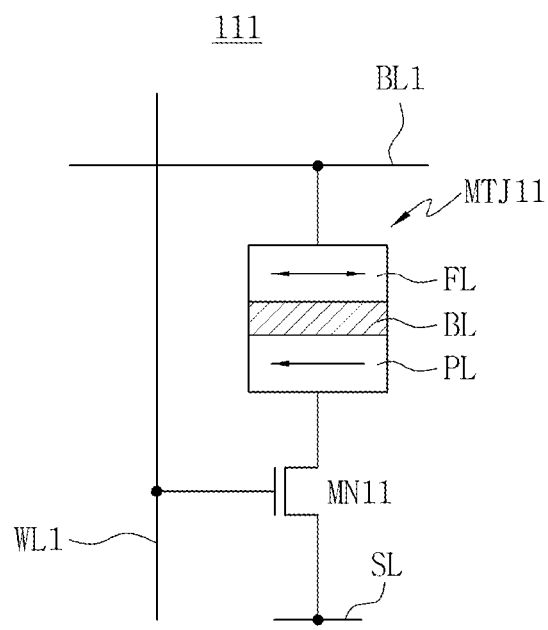
FIG. 3 is a circuit diagram of an example of an MRAM cell constituting the memory cell array of FIG. 2.

FIG. 3 is a circuit diagram further illustrating, as an example, a MRAM cell 111 that may be incorporated in the memory cell array 1500 of FIG. 2.

Referring to FIG. 3, the MRAM cell 111 comprises a cell transistor MN11 including an NMOS transistor and an MTJ element MTJ11. The cell transistor MN11 has a gate connected to the word line WL1, and a source connected to the source line SL. The MTJ element MTJ11 is connected between a drain of the cell transistor MN11 and the bit line BL1.

Figure 4:
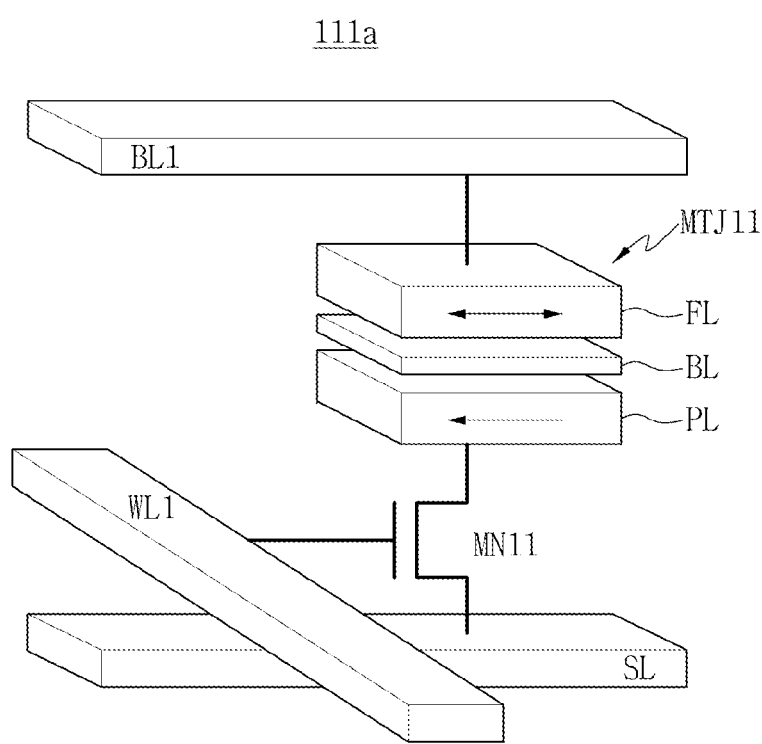
FIG. 4 is a three-dimensional diagram of the MRAM cell of FIG. 3.

FIG. 4 is a three-dimensional diagram further illustrating in one embodiment one possible connection structure for the MRAM cell 111 of FIG. 3.

Referring to FIG. 4, the MTJ element MTJ11 includes a pinned layer (PL) having a predetermined pinned magnetization direction, a free layer (FL) magnetized in the direction of an externally applied magnetic field, and a tunnel barrier layer (BL) formed using an insulating film between the pinned layer PL and the free layer FL. To pin the magnetization direction of the pinned layer PL, the MTJ element MTJ11 may further include an anti-ferromagnetic layer (not shown). The MTJ element MTJ11 of FIG. 4 may be an MTJ element constituting a spin-torque transfer magneto-resistive random access memory (STT-MRAM).

To enable a write operation of the STT-MRAM, the cell transistor MN11 may be turned ON by applying a logic-high voltage to the word line WL1, and a write current may then be applied between the bit line BL1 and the source line SL. To enable a read operation of the STT-MRAM, the cell transistor MN11 may be turned ON by applying a logic-high voltage to the word line WL1, and then a read current may applied from the bit line BL1 toward a source line SL0 so that data stored in the MTJ cell can be determined according to a detected resistance.

Figure 5:
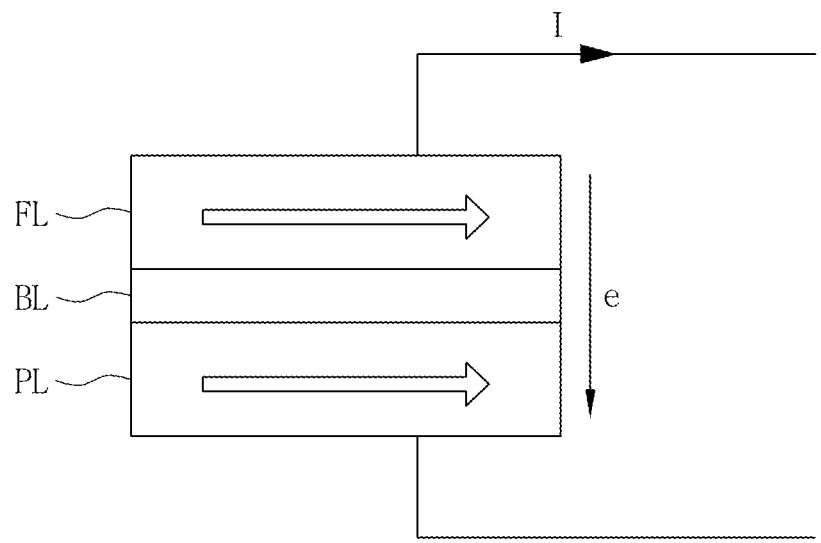
FIGS. 5 and 6 are diagrams showing magnetization directions of a magnetic tunnel junction (MTJ) element relative to written data.
Figure 6:
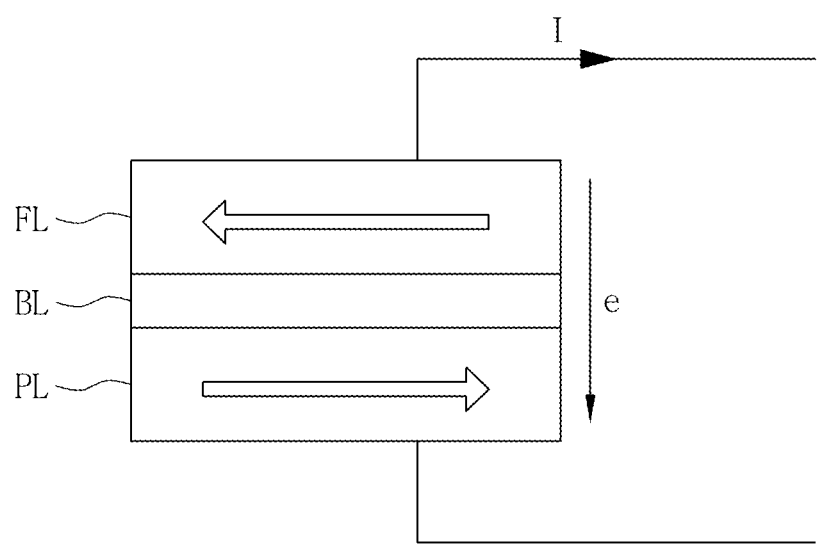

FIGS. 5 and 6 are conceptual diagrams further illustrating magnetization directions for an MTJ element during a written operation. The resistance of the MTJ element will vary according to the magnetization direction of the free layer FL. When a read current 'I' is supplied to the MTJ element, a data voltage is output according to the resistance of the MTJ element. Since the read current I has a level less than a write current, the magnetization direction of the free layer FL will not be shifted by application of the read current I.

Referring to the MTJ element of FIG. 5, the magnetization direction of the free layer FL is the same as the magnetization direction of the pinned layer PL. Accordingly, the MTJ element exhibits a relatively low resistance. This condition may be interpreted as indicating a stored data value of '0'.

Referring to the MTJ element of FIG. 6, the magnetization direction of the free layer FL is the opposite of the magnetization direction of the pinned layer PL. Accordingly, the MTJ element exhibits a relatively high resistance. This condition may be interpreted as indicating a stored data value of '1'.

It should be noted at this point that the free layer FL and pinned layer PL of the MTJ cell illustrated in FIGS. 5 and 6 are arbitrarily assumed to be horizontally aligned. This need not be the case. For example, in other embodiments of the inventive concept the free layer FL and pinned layer may be vertically aligned.

Figure 7:
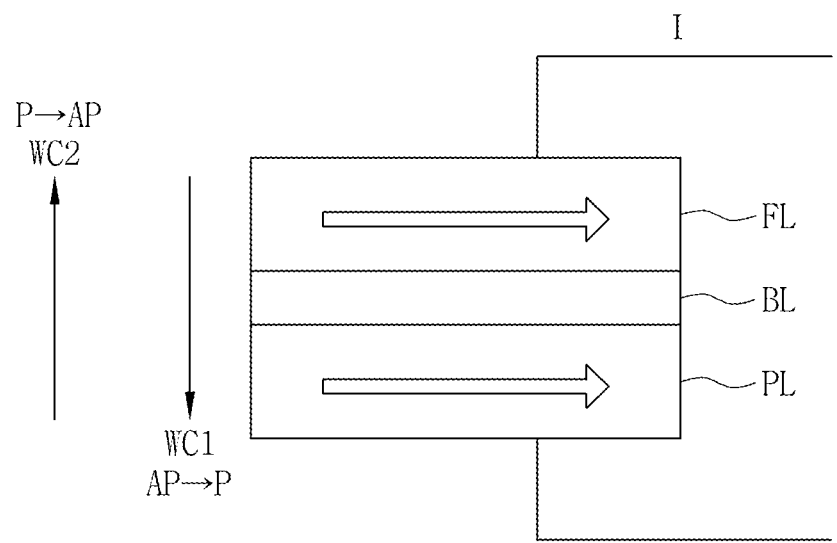
FIG. 7 is a conceptual diagram further illustrating a write operation for the MRAM device of FIG. 1.

FIG. 7 is a conceptual diagram further illustrating execution of a write operation in relation to the MRAM device of FIG. 1.

Referring to FIG. 7, the magnetization direction of a free layer FL may be determined according to the directions of write currents WC1 and WC2 passing through an MTJ element. For instance, when the first write current WC1 is applied, free electrons having the same spin direction as the pinned layer PL will apply torque to the free layer FL. Thus, the free layer FL may be magnetized "parallel to" the pinned layer PL. When the second write current WC2 is applied, electrons having an opposite spin direction to the pinned layer PL will return to the free layer FL and apply torque. As a result, the free layer FL may be magnetized "anti-parallel to" the pinned layer PL. In this manner, the magnetization direction of the free layer FL may be shifted in response to spin-transfer torque (STT).

FIGS. 8, 9, 10, 1 and 12 are conceptual diagrams further illustrating an MTJ element that may be included in the memory cell array of FIG. 2 according to various embodiments of the inventive concept.

Figure 8:
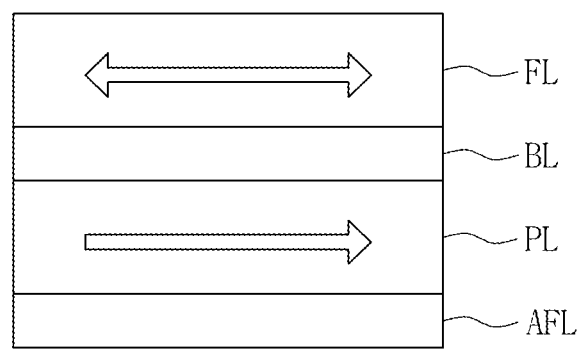
FIGS. 8, 9 10, 11 and 12 are conceptual diagrams further illustrating an MTJ element that may be included in the memory cell array of FIG. 2 according to certain embodiments of the inventive concept.
Figure 9:
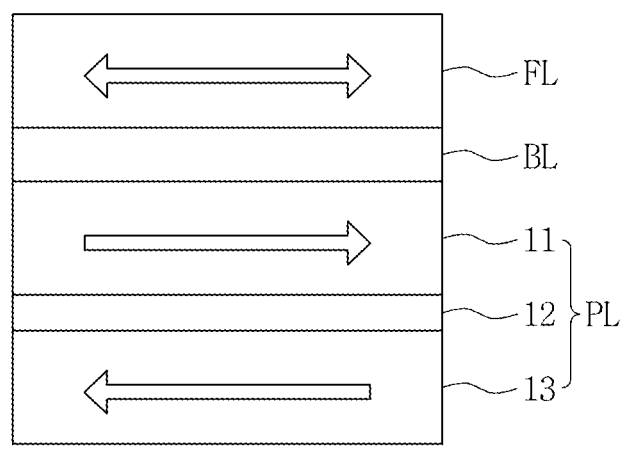

FIGS. 8 and 9 are conceptual diagrams illustrating MTJ elements having a horizontal magnetization direction in an STT-MRAM according to embodiments of the inventive concept. An MTJ element having a horizontal magnetization direction refers to an MTJ element in which a direction in which current moves is substantially vertical to a magnetization easy axis.

Referring to FIG. 8, an MTJ element may include a free layer FL, a tunnel barrier layer BL, a pinned layer PL, and an anti-ferromagnetic layer (AFL).

The free layer FL may include a material having a changeable magnetization direction. The magnetization direction of the free layer FL may be changed due to electric/magnetic factors provided outside and/or inside a memory cell. The free layer FL may include a ferromagnetic material containing at least one of cobalt (Co), iron (Fe), and nickel (Ni). For instance, the free layer FL may include at least one selected out of iron boron (FeB), Fe, Co, Ni, gadolinium (Gd), dysprosium (Dy), CoFe, NiFe, manganese arsenide (MnAs), manganese bismuth (MnBi), manganese antimony (MnSb), chromium oxide ($CrO_2$), manganese ferrite ($MnOFe_2O_3$), iron ferrite ($FeOFe_2O_3$), nickel ferrite ($NiOFe_2O_3$), copper ferrite ($CuOFe_2O_3$), magnesium ferrite ($MgOFe_2O_3$), europium oxide (EuO), and yttrium iron garnet ($Y_3Fe_5O_{12}$).

The tunnel barrier layer BL may have a thickness less than a spin diffusion distance. The tunnel barrier layer BL may include a non-magnetic material. In an example, the tunnel barrier layer BL may include at least one selected out of oxides of magnesium (Mg), titanium (Ti), aluminum (Al), magnesium-zinc (MgZn), and magnesium-boron (MgB) and nitrides of Ti and vanadium (V).

The pinned layer PL may have a magnetization direction pinned by the anti-ferromagnetic layer AFL. Also, the pinned layer PL may include a ferromagnetic material. For example, the pinned layer PL may include at least one selected out of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer AFL may include an anti-ferromagnetic material. For example, the anti-ferromagnetic layer AFL may include at least one selected out of platinum manganese (PtMn), iridium manganese (IrMn), MnO, manganese sulfide (MnS), manganese tellurium (MnTe), manganese fluoride ($MnF_2$), iron chloride ($FeCl_2$), FeO, $CoCl_2$, CoO, $NiCl_2$, NiO, and Cr.

In another embodiment of the inventive concept, since each of a free layer and a pinned layer of an MTJ element is formed of a ferromagnetic material, a stray field may be generated at an edge of the ferromagnetic material. The stray field may reduce magnetoresistance or increase the resistive magnetic force of the free layer and affect switching characteristics, thereby forming asymmetric switching. Accordingly, it is necessary to reduce or control a stray field generated in the ferromagnetic material of the MTJ element.

Referring to FIG. 9, the pinned layer PL of the MTJ element may be formed of a synthetic anti-ferromagnetic (SAF) material. The pinned layer PL may include a first ferromagnetic layer 11, a coupling layer 12, and a second ferromagnetic layer 13. Each of the first and second ferromagnetic layers 11 and 13 may include at least one selected out of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the magnetization direction of the first ferromagnetic layer 11 may be different from the magnetization direction of the second ferromagnetic layer 13. Each of the magnetization directions of the first and second ferromagnetic layers 11 and 13 may be pinned. The coupling layer 12 may include ruthenium (Ru).

Figure 10:
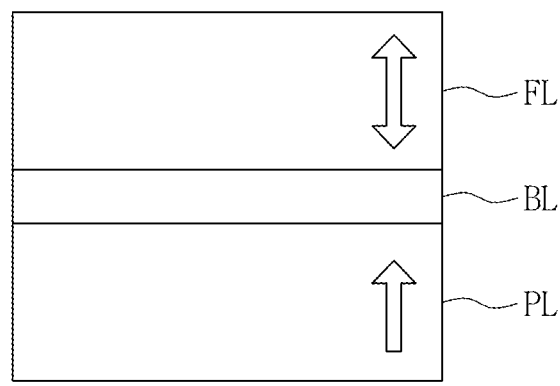

FIG. 10 is a conceptual diagram of an MTJ element of an STT-MRAM according to another embodiment of the inventive concept. In an MTJ element having a vertical magnetization direction, the direction in which current moves may be substantially parallel to a magnetization easy axis. Referring to FIG. 10, the MTJ element may include a free layer FL, a pinned layer PL, and a tunnel barrier layer BL.

When the magnetization direction of the free layer FL is parallel to the magnetization direction of the pinned layer PL, resistance is decreased. In contrast, when the magnetization direction of the free layer FL is anti-parallel to the magnetization direction of the pinned layer FL, resistance is increased. Different data value may be stored in relation to these different resulting resistances.

To embody the MTJ element having the vertical magnetization direction, each of the free layer FL and the pinned layer PL may be formed of a material having a high magnetic isotropic energy. Materials having high magnetic isotropic energies may include an amorphous rare-earth alloy, a multilayered thin layer, such as (Co/Pt)n or (Fe/Pt)n, or an ordered-lattice material having an L10 crystal structure. For example, the free layer FL may be formed of an ordered alloy and include at least one of iron (Fe), cobalt (Co), nickel (Ni), palladium (Pd), and platinum (Pt). For instance, the free layer FL may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Chemical quantitative expressions of the above-described alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $CO_{30}Ni_{20}Pt_{50}$.

The pinned layer PL may be formed of an ordered alloy and include at least one of Fe, Co, Ni, Pd, and Pt. For example, the pinned layer PL may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. Chemical quantitative expressions of the above-described alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $CO_{30}Ni_{20}Pt_{50}$.

Figure 11:
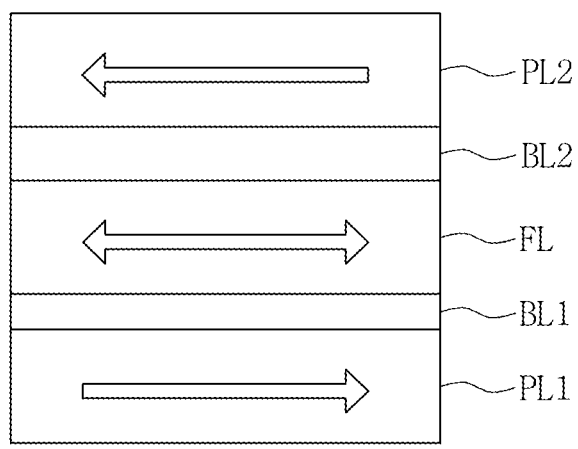
Figure 12:
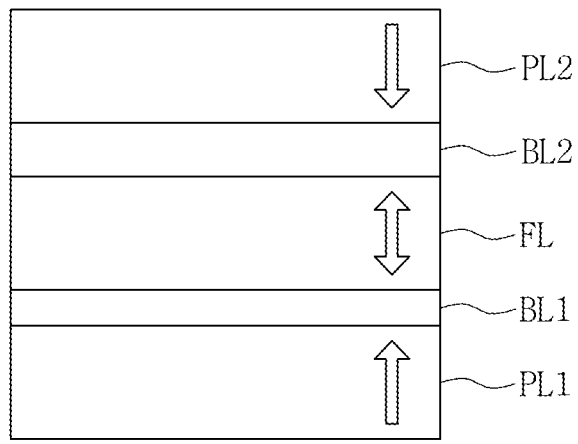

FIGS. 11 and 12 are conceptual diagrams further illustrating dual MTJ elements which are MTJ elements included in STT-MRAMs according to certain embodiments of the inventive concept. A dual MTJ element may be configured such that a tunnel barrier layer and a pinned layer are respectively disposed on both ends of a free layer.

Referring to FIG. 11, a dual MTJ element configured to form a horizontal magnetic field may include a first pinned layer PL2, a first tunnel barrier layer BL2, a free layer FL, a second tunnel barrier layer BL1, and a second pinned layer PL1. Each of the first pinned layer PL2, the first tunnel barrier layer BL2, the free layer FL, the second tunnel barrier layer BL1, and the second pinned layer PL1 may include the same or similar materials to the corresponding one of the free layer FL, the tunnel barrier layer BL, and the pinned layer PL of FIG. 8.

In this case, when the first pinned layer PL2 is pinned in an opposite magnetization direction to the second pinned layer PL1, magnetic forces caused by the first and second pinned layers PL2 and PL1 may substantially counteract. Accordingly, the dual MTJ element may enable a write operation using a smaller current than a typical MTJ element.

In addition, since the dual MTJ element exhibits a higher resistance during a read operation due to the second tunnel barrier layer BL1 and data discrimination may be improved as a result.

Referring to FIG. 12, a dual MTJ element configured to form a vertical magnetic field may include a first pinned layer PL2, a first tunnel barrier layer BL2, a free layer FL, a second tunnel barrier layer BL1, and a second pinned layer PL1. Each of the first pinned layer PL2, the first tunnel barrier layer BL2, the free layer FL, the second tunnel barrier layer BL1, and the second pinned layer PL1 may include the same or similar materials to the corresponding one of the free layer FL, the tunnel barrier layer BL, and the pinned layer PL of FIG. 10.

In this case, when the first pinned layer PL2 is pinned in an opposite magnetization direction to the second pinned layer PL1, magnetic forces caused by the first and second pinned layers PL2 and PL1 may substantially counteract. Accordingly, the dual MTJ element may enable write operations using a relatively low level current than a typical MTJ element.

Figure 13:
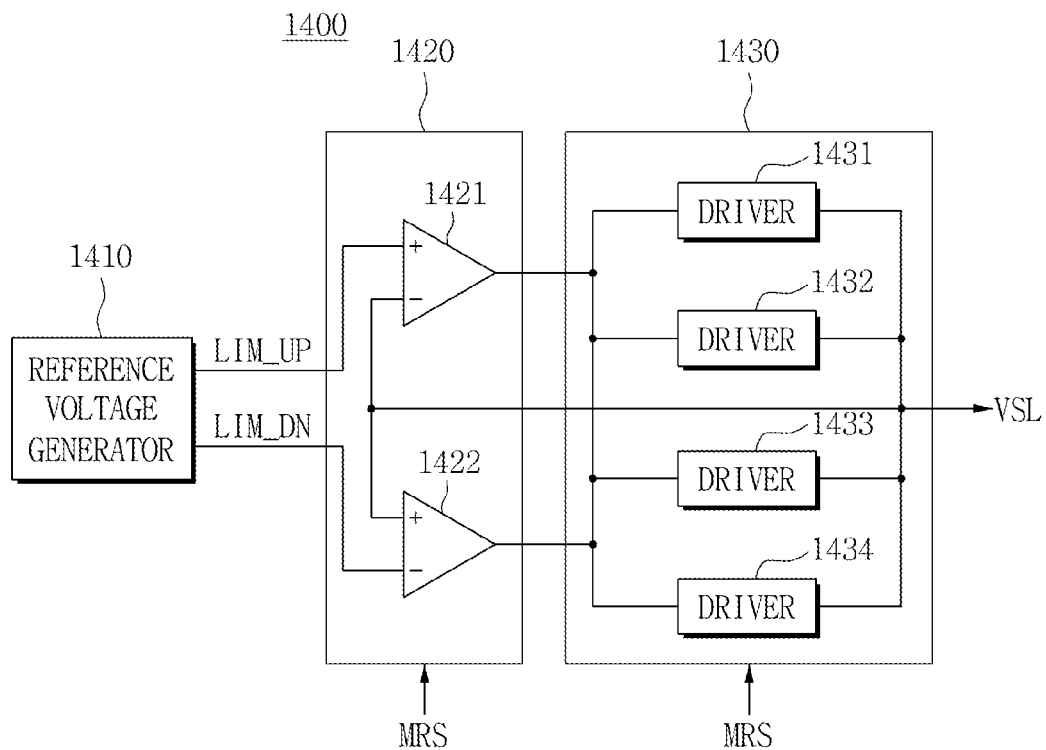
FIG. 13 is a circuit diagram of one example of a source line voltage generator that may be included in the MRAM device of FIG. 1.

FIG. 13 is a circuit diagram illustrating one example of the source line voltage generator 1400 that may be included in the MRAM device 1000 of FIG. 1.

Referring to FIG. 13, the source line voltage generator 1400 comprises a reference voltage generator 1410, a differential amplifier 1420, and a source line driver 1430.

The reference voltage generator 1410 may be used to generate an up limit LIM_UP and a down limit LIM_DN. The differential amplifier 1420 may be used to feed-back the source line voltage VSL, amplify a difference between the source line voltage VSL and the up limit LIM_UP, generate a corresponding first voltage signal, amplify a difference between the source line voltage VSL and the down limit LIM_DN, and generate a corresponding second voltage signal. The source line driver 1430 may be used to generate the source line voltage VSL in response to the first voltage signal and second voltage signal.

The differential amplifier 1420 may be disabled during the standby and/or power-down modes. For example, the differential amplifier 1420 may be disabled in response to an MRS signal.

Likewise, the source line driver 1430 may be disabled during the standby and/or power-down modes. Here again, the source line driver 1430 may be disabled in response to the MRS signal.

In the illustrated embodiment of FIG. 13, the source line driver 1430 includes a plurality of drivers 1431 to 1434 connected in parallel. At least one of the plurality of drivers 1431 to 1434 may be disabled in response to the MRS signal.

Figure 14:
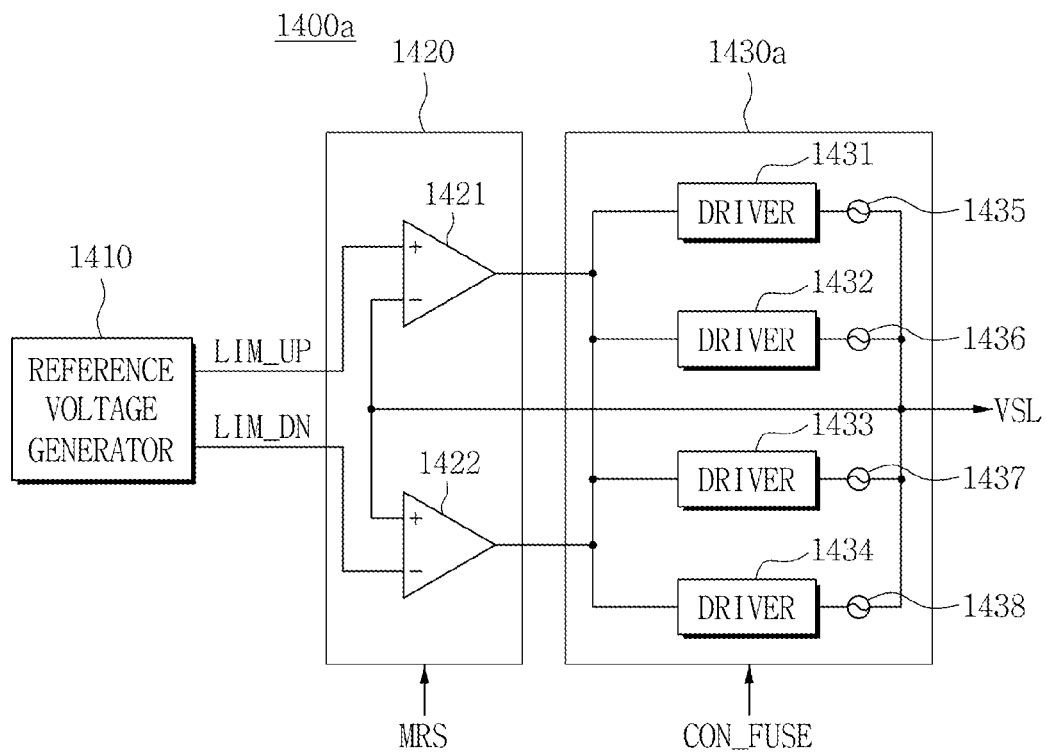
FIG. 14 is a circuit diagram of another example of the source line voltage generator that may be included in the MRAM device of FIG. 1.

FIG. 14 is a circuit diagram illustrating another example of the source line voltage generator 1400 that may be included in the MRAM device 1000 of FIG. 1.

Referring to FIG. 14, a source line voltage generator 1400a comprises a reference voltage generator 1410, a differential amplifier 1420, and a source line driver 1430a.

The source line driver 1430a may be used to generate a source line voltage VSL in response to an output voltage signal of the differential amplifier 1420. The source line driver 1430a may be disabled during the standby and/or power-down modes. For example, the, the source line driver 1430a may be disabled in response to an MRS signal.

The source line driver 1430a includes a plurality of first circuits coupled in parallel between an output node of the differential amplifier 1420 and an output node of the source line driver 1430a. Each of the first circuits includes a driver 1431, 1432, 1433, and 1434 respectively series-connected with a fuse 1435, 1436, 1437, and 1438. The fuses 1435, 1436, 1437, and 1438 included in the source line driver 1430a may be selectively "cut" in response to a fuse control signal CON_FUSE.

Figure 15:
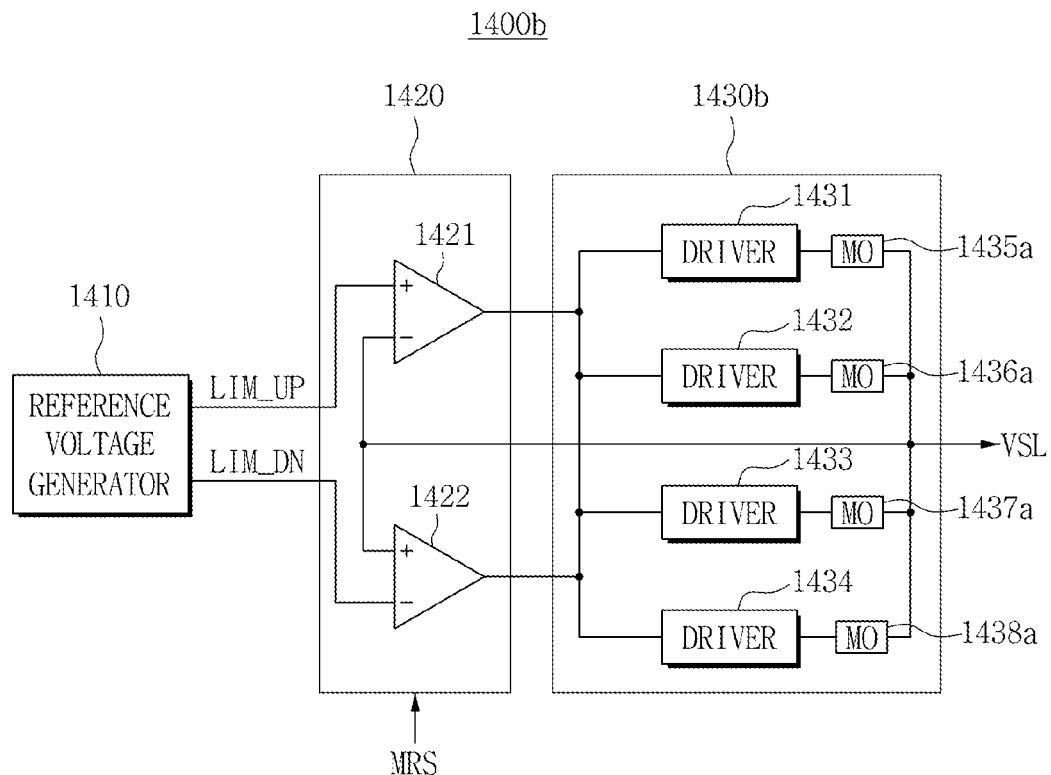
FIG. 15 is a circuit diagram of still another example of the source line voltage generator that may be included in the MRAM device of FIG. 1.

FIG. 15 is a circuit diagram illustrating still example of the source line voltage generator 1400 that may be included in the MRAM device 1000 of FIG. 1.

Referring to FIG. 15, a source line voltage generator 1400b comprises a reference voltage generator 1410, a differential amplifier 1420, and a source line driver 1430b.

The source line driver 1430b may be used to generate a source line voltage VSL in response to an output voltage signal of the differential amplifier 1420. The source line driver 1430b may be disabled in the standby and/or power-down modes.

The source line driver 1430b includes a plurality of first circuits coupled in parallel between an output node of the differential amplifier 1420 and an output node of the source line driver 1430b. Each of the first circuits includes a driver 1431, 1432, 1433, and 1434 respectively series-connected to an option metal 1435a, 1436a, 1437a, and 1438a. The source line driver 1430b may be fabricated to selectively include one or more of the option metal 1435a, 1436a, 1437a, and 1438a in conjunction with the drivers 1431, 1432, 1433, and 1434. The absence of a particular option metal will effectively cut the output node of the corresponding driver in the source line driver 1430b.

The MRAM device 1000 including the source line voltage generator 1400 shown in FIGS. 14 and 15 may control the magnitude of a source line driving voltage using fuses or option metals.

Figure 16:
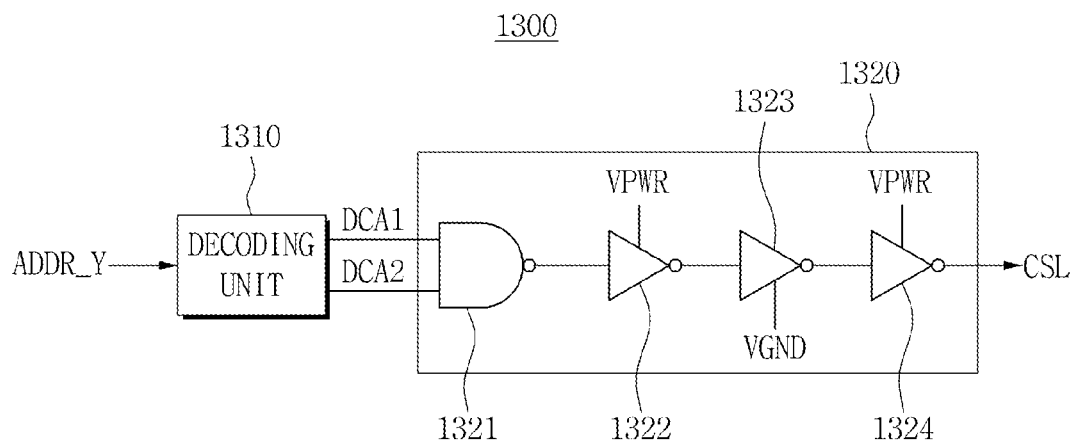
FIG. 16 is a circuit diagram of a column decoder that may be included in the MRAM device of FIG. 1.

FIG. 16 is a circuit diagram illustrating one example of the column decoder 1300 that may be included in the MRAM device 1000 of FIG. 1.

Referring to FIG. 16, the column decoder 1300 comprises a decoding unit 1310 and a power gating unit 1320. The decoding unit 1310 decodes a column address ADDR_Y and generates corresponding decoded column addresses DCA1 and DCA2. The power gating unit 1320 performs a power gating operation on the decoded column addresses DCA1 and DCA2 to generate a column selection signal CSL.

In the illustrated example of FIG. 16, the power gating unit 1320 include a NAND circuit 1321, a first inverter 1322, a second inverter 1323, and a third inverter 1324. The NAND circuit 1321 may perform a logical NAND operation on the first decoded column address DCA1 and second decoded column address DCA2. The first inverter 1322 operates in response to a virtual power supply voltage VPWR and inverts the phase of the signal output by the NAND circuit 1321. The second inverter 1323 operates in response to a virtual ground voltage VGND and inverts the phase of the signal output by the first inverter 1322. The third inverter 1324 also operates in response to the virtual power supply voltage VPWR and inverts the phase of the signal output by the second inverter 1323.

In certain embodiments of the inventive concept, the virtual power supply voltage VPWR and virtual ground voltage VGND are not be applied to the power gating unit 1320 during a precharge mode.

Although the above-described embodiments pertain to an example in which a power gating operation is applied to the column decoder 1300 of the MRAM device 1000 of FIG. 1, the power gating operation may also be to the row decoder 1200, the address input buffer 1100, the command decoder 1050, the write driver 1520, the I/O sense amplifier 1600, and the I/O circuit 1700.

Figure 17:
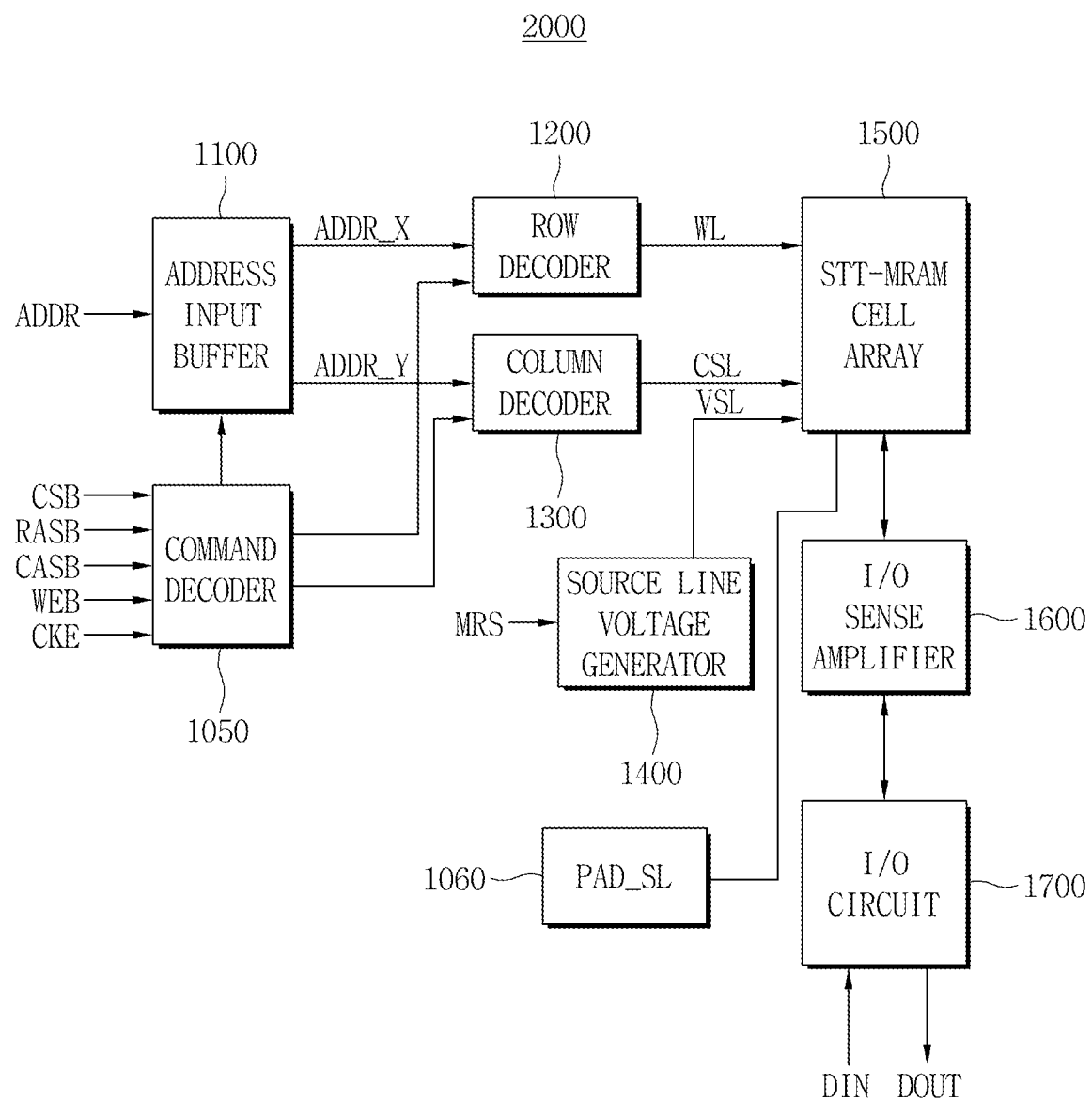
FIG. 17 is a block diagram of an MRAM device according to an embodiment of the inventive concept.

FIG. 17 is a block diagram of an MRAM device 2000 according to another embodiment of the inventive concept.

Referring to FIG. 17, the MRAM device 2000 comprises a command decoder 1050, an address input buffer 1100, a row decoder 1200, a column decoder 1300, a source line voltage generator 1400, a memory cell array 1500, an I/O sense amplifier 1600, an I/O circuit 1700, and a source line pad (PAD_SL) 1060.

In relation to the MRAM of FIG. 1, the MRAM device 2000 of FIG. 17 further comprises the source line pad 1060 which is configured to supply an external voltage to a source line of the STT-MRAM cells in the MRAM device 2000. Since the MRAM device 2000 further includes the source line pad 1060, the MRAM device 2000 may apply an external voltage through the source line pad 1060 and test characteristics of the memory cell array 1500 during fabrication of the MRAM device 2000 (e.g., at a wafer level and/or at a chip level prior to packaging).

Figure 18:
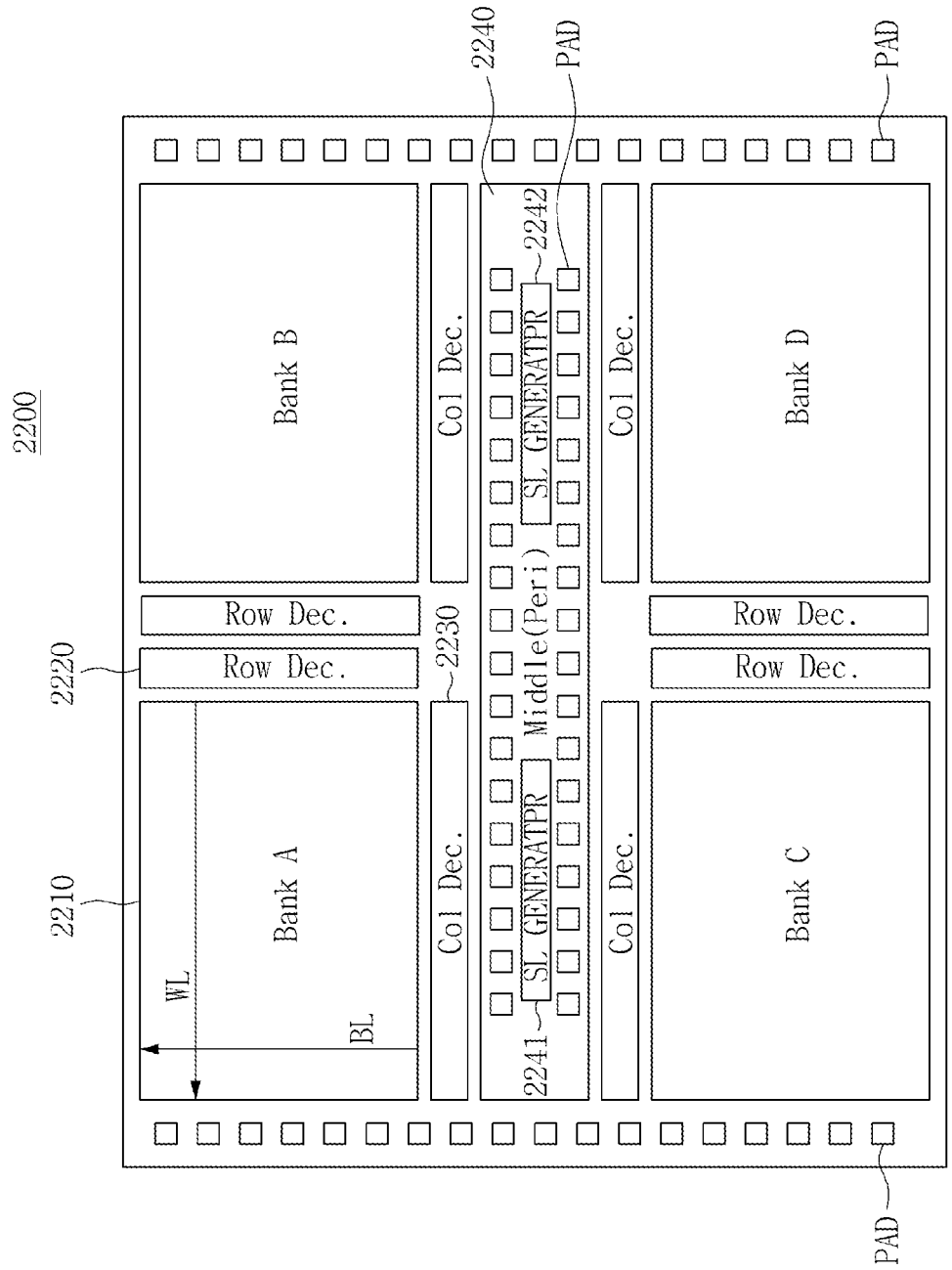
FIG. 18 is a layout of an MRAM device including a source line voltage generator according to an embodiment of the inventive concept.

FIG. 18 is a layout diagram for an MRAM device including a source line voltage generator according to certain embodiments of the inventive concept.

Referring to FIG. 18, a semiconductor memory chip 2200 generally includes four (4) banks; Bank A, Bank B, Bank C, and Bank D. A cell array including a plurality of STT-MRAM cells may be disposed in relation to the four banks. A row decoder 2220 and a column decoder 2230 are disposed adjacent to each one of the four banks. Also, certain connection pads (PAD) are disposed on at least one edge of the semiconductor memory chip 2200 as well as in a peripheral region centrally disposed in the semiconductor memory chip 2200. As will be appreciated by those skilled in the art, a multiplicity of pads is required to communicate various signals (e.g., power, address, data and control signals) with external circuitry.

In addition, source line voltage generators 2241 and 2242 may be disposed in the centrally located peripheral region of the semiconductor memory chip 2200. Although FIG. 18 illustrates only two (2) source line voltage generators 2241 and 2242, any reasonable number of source line voltage generators may be provided in relation to one or more memory banks. In certain embodiments of the inventive concept, each one of the memory banks will be independently supplied with a source line driving voltage by a corresponding source voltage generator. Alternatively, one source line voltage generator may be shared by two or more (and maybe all) of the memory banks of the semiconductor memory chip 2200.

In the illustrated embodiment of FIG. 18, the row decoder 2220 is disposed in a widthwise direction while the column decoder 2230 is disposed in a lengthwise direction of the semiconductor memory chip 2200. Additionally, it is assumed that the row decoders 2220 allocated respectively to two widthwise adjacent banks are disposed adjacent to one another and share a control line (not shown) therebetween.

The number of memory banks (e.g., four) illustrated in the semiconductor memory chip 2200 is arbitrary, and those skilled in the art will recognize that any reasonable number and arrangement of memory banks may be used in other embodiments of the inventive concept.

Figure 19:
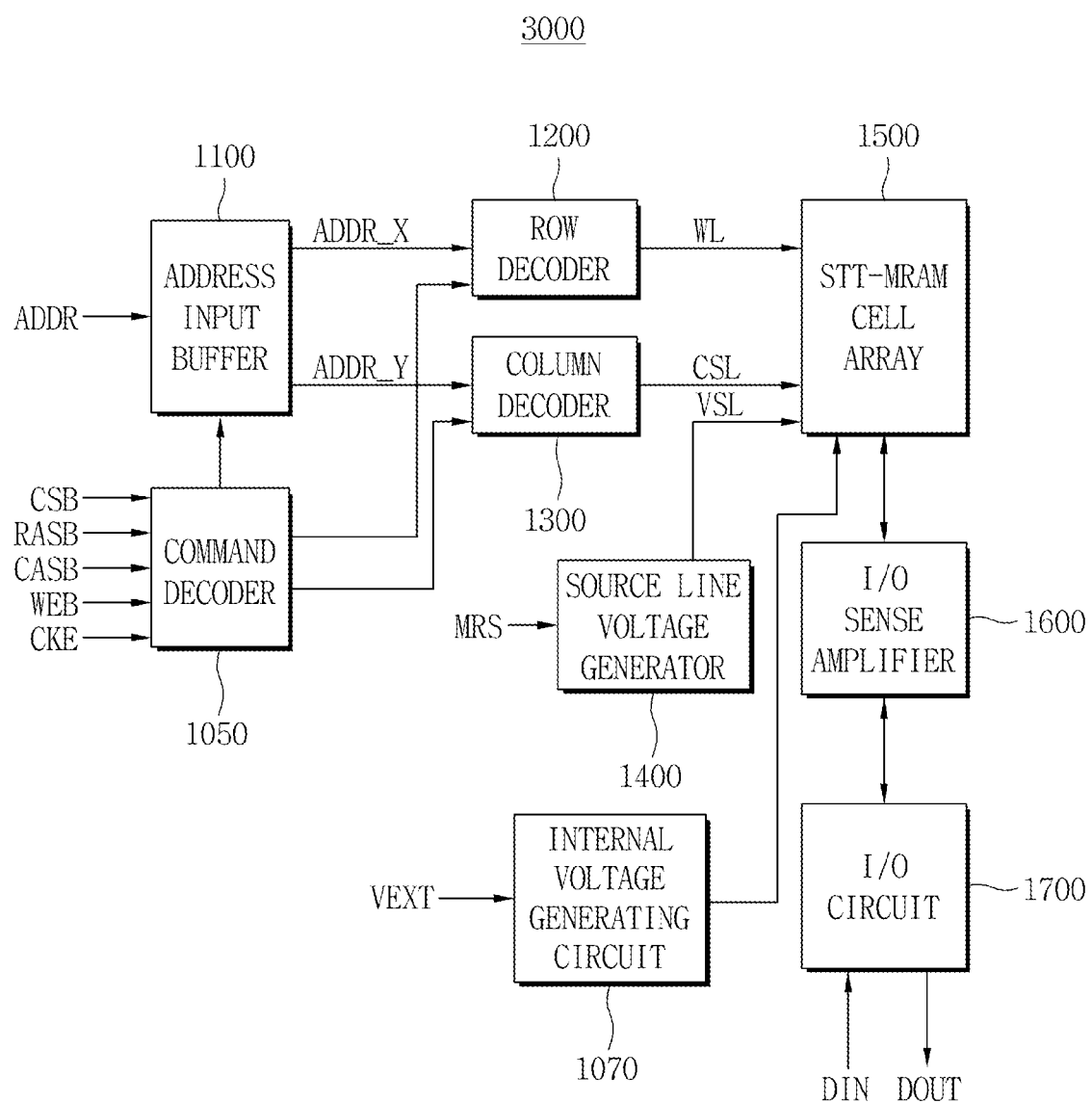
FIG. 19 is a block diagram of an MRAM device according to an embodiment of the inventive concept.

FIG. 19 is a block diagram of an MRAM device 3000 according to an embodiment of the inventive concept.

Referring to FIG. 19, the MRAM device 3000 comprises a command decoder 1050, an address input buffer 1100, a row decoder 1200, a column decoder 1300, a source line voltage generator 1400, a memory cell array 1500, an I/O sense amplifier 1600, an I/O circuit 1700, and an internal voltage generating circuit 1070.

The internal voltage generating circuit 1070 may be used to generate various voltages required for circuit blocks of the MRAM device 3000. The internal voltage generating circuit 1070 may generate an internal voltage in response to an externally provided voltage (VEXT).

Figure 20:
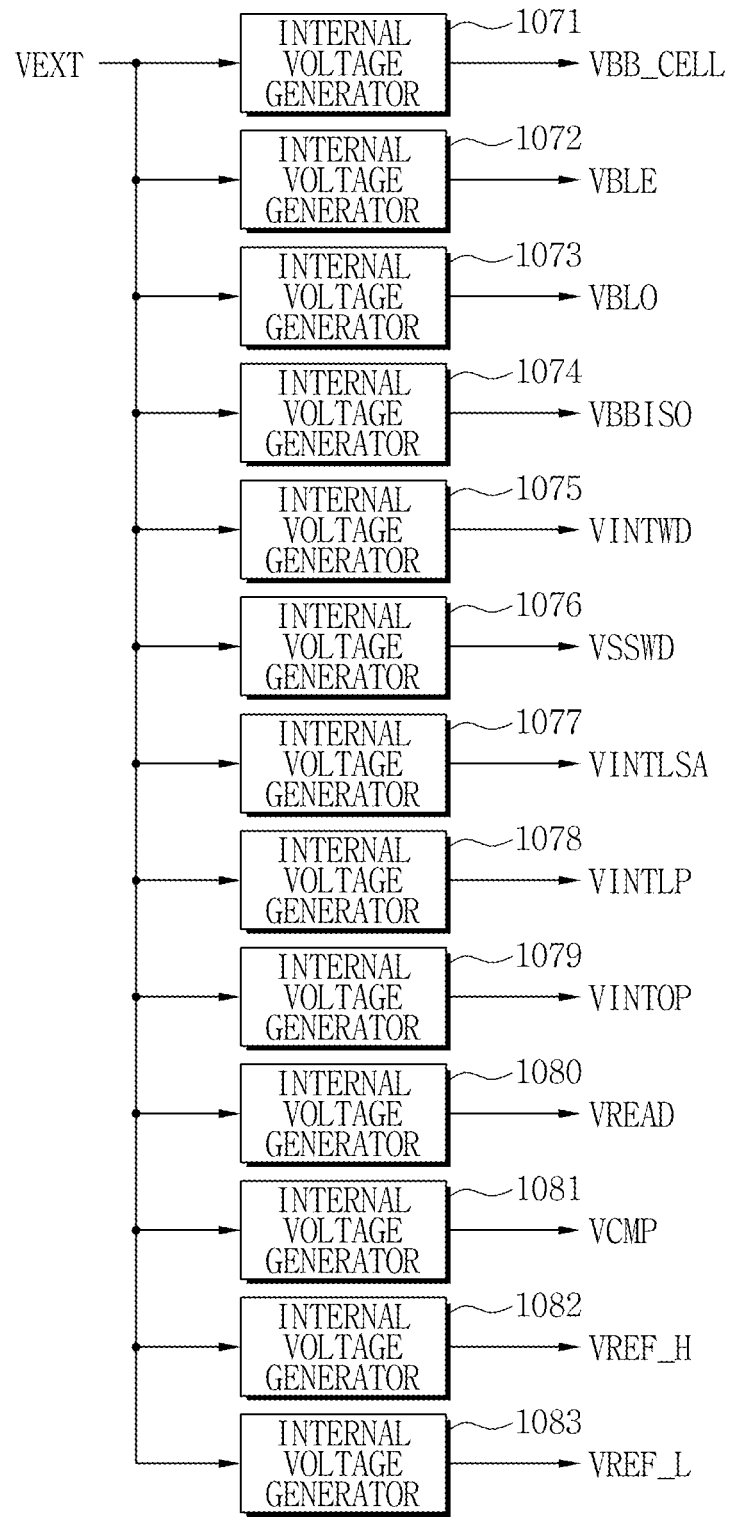
FIG. 20 is a circuit diagram of an internal voltage generating circuit that may be included in the MRAM device of FIG. 19.

FIG. 20 is a circuit diagram illustrating one example of an internal voltage generating circuit 1070 that mat be included in the MRAM device 3000 of FIG. 19.

Referring to FIG. 20, the internal voltage generating circuit 1070 comprises first through thirteenth internal voltage generators 1071 to 1083.

The first internal voltage generator 1071 may generate a bulk voltage VBB_CELL for a memory cell array in response to the external voltage VEXT. The second internal voltage generator 1072 may generate an even precharge voltage VBLE required to precharge bit lines and local I/O lines in response to the external voltage VEXT. The third internal voltage generator 1073 may generate an odd precharge voltage VBLO required to precharge the bit lines and the local I/O lines in response to the external voltage VEXT. The fourth internal voltage generator 1074 may generate an isolation gate disable voltage VBBISO required to disable an isolation gate of a memory cell array in response to the external voltage VEXT. The fifth internal voltage generator 1075 may generate a write driver power supply voltage VINTWD in response to the external voltage VEXT. The sixth internal voltage generator 1076 may generate a write driver ground voltage VSSWD in response to the external voltage VEXT. The seventh internal voltage generator 1077 may generate a read bias voltage VINTLSA in response to the external voltage VEXT. The eighth internal voltage generator 1078 may generate a read precharge voltage VINTLP in response to the external voltage VEXT. The ninth internal voltage generator 1079 may generate a unit gain amplification voltage VINTOP in response to the external voltage VEXT. The tenth internal voltage generator 1080 may generate a bit line clamp voltage VREAD in response to the external voltage VEXT. The eleventh internal voltage generator 1081 may generate a read clamp gate voltage VCMP in response to the external voltage VEXT. The twelfth internal voltage generator 1082 may generate a high reference voltage VREF_H of a sense amplifier in response to the external voltage VEXT. The thirteenth internal voltage generator 1083 may generate a low reference voltage VREF_L of the sense amplifier in response to the external voltage VEXT.

Figure 21:
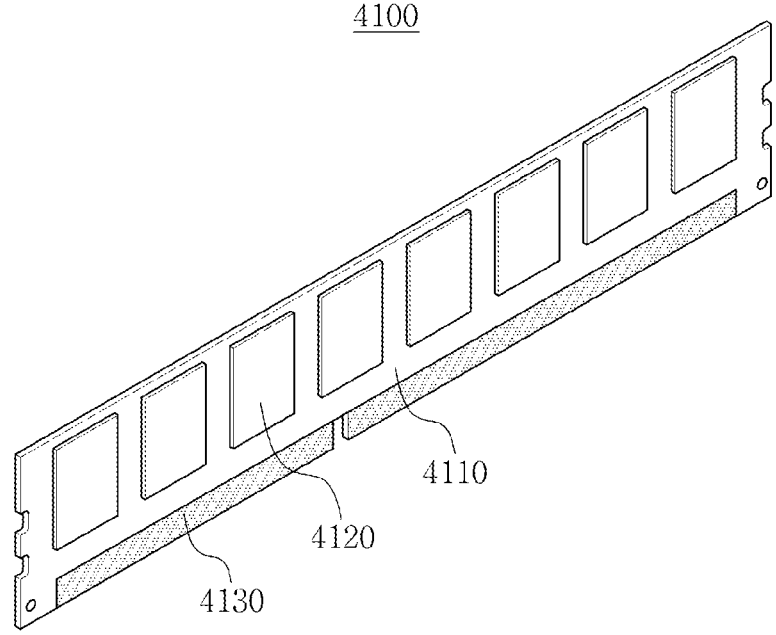
FIGS. 21, 22 and 23 are diagrams illustrating memory modules that may include one or more MRAM devices according to embodiments of the inventive concept.
Figure 22:
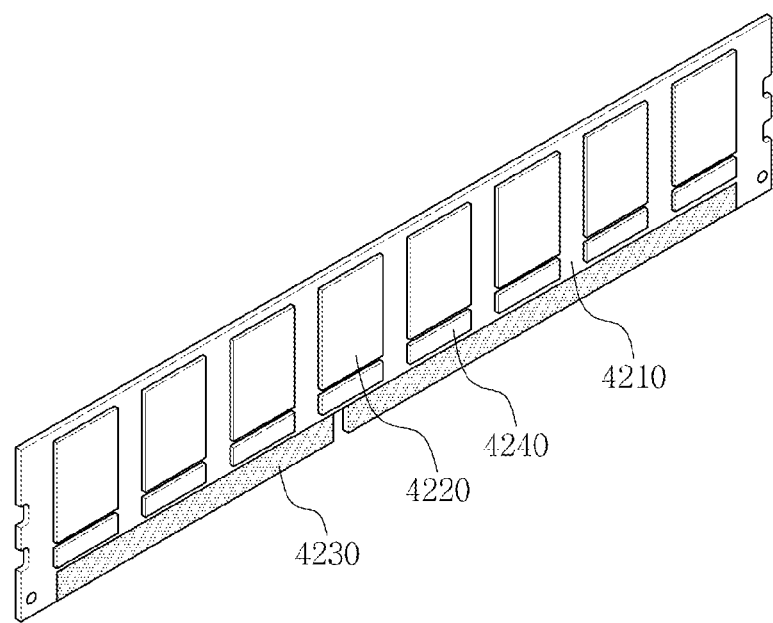
Figure 23:
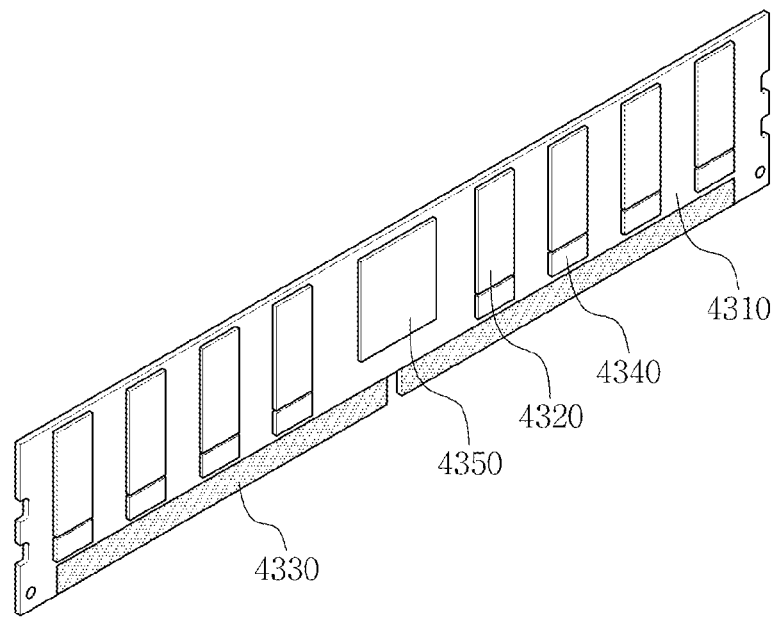

FIGS. 21, 22 and 23 are diagrams illustrating memory modules 4100, 4200, and 4300 that may include one or more MRAM devices according to embodiments of the inventive concept.

Referring to FIG. 21, the memory module 4100 comprises a printed circuit board (PCB) 4110, a plurality of MRAM chips 4120, and a connector 4130. The plurality of MRAM chips 4120 may be provided on top and bottom surfaces of the PCB 4110. The connector 4130 may be used to electrically connect the plurality of MRAM chips 4120 through conductive lines (not shown). Also, the connector 4130 may be connected to a slot of an external host.

Referring to FIG. 22, the memory module 4200 comprises a PCB 4210, a plurality of MRAM chips 4220, a connector 4230, and a plurality of buffers 4240. Each of the plurality of buffers 4240 may be disposed between the corresponding one of the MRAM chips 4220 and the connector 4230.

The MRAM chips 4220 and the buffers 4240 may be provided on top and bottom surfaces of the PCB 4210. The MRAM chips 4220 and the buffers 4240 formed on the top and bottom surfaces of the PCB 4210 may be connected through a plurality of via holes.

Referring to FIG. 23, the memory module 4300 comprises a PCB 4310, a plurality of MRAM chips 4320, a connector 4330, a plurality of buffers 4340, and a centrally disposed controller 4350.

The MRAM chips 4320 and the buffers 4340 may be provided on top and bottom surfaces of the PCB 4310. The MRAM chips 4320 and the buffers 4340 formed on the top and bottom surfaces of the PCB 4310 may be connected through a plurality of via holes.

Figure 24:
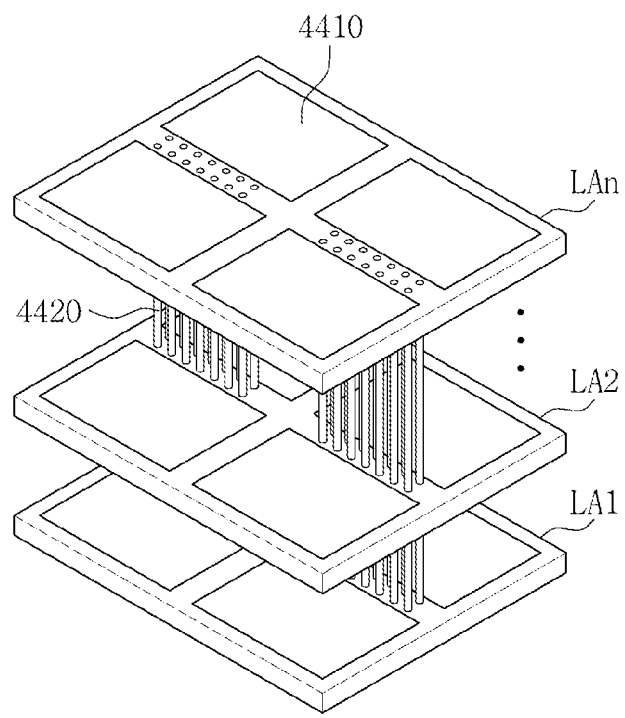
FIG. 24 is a simplified perspective view of a semiconductor device having a stack structure including an MRAM device according to an embodiment of the inventive concept.

FIG. 24 is a perspective view of a stack semiconductor device 4400 including a plurality of semiconductor layers according to an embodiment of the inventive concept. In the memory modules 4100, 4200, and 4300 of FIGS. 21 through 23, each of the MRAM chips 4120, 4220, and 4320 may include a plurality of semiconductor layers LA1 to LAn.

In the stack semiconductor device 4400, the plurality of stacked semiconductor layers LA1 to LAn may be connected to one another through through-silicon vias (TSVs) 4420.

Each of the semiconductor layers LA1 to LAn may include cell arrays 4410 including STT-MRAM cells.

Figure 25:
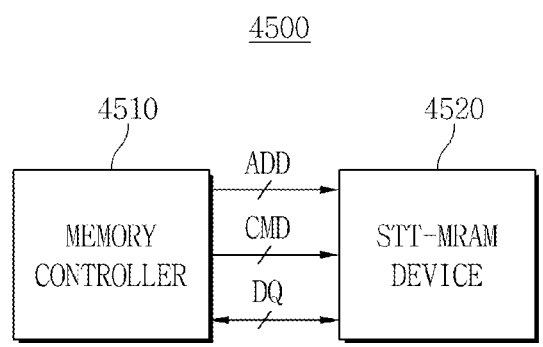
FIG. 25 is a general block diagram a memory system including an MRAM device according to an embodiment of the inventive concept.

FIG. 25 is a general block diagram of a memory system 4500 including an MRAM device 4520 according to an embodiment of the inventive concept.

Referring to FIG. 25, the memory system 4500 comprises a memory controller 4510 and the MRAM device 4520.

The memory controller 4510 may be used to generate one or more address signal(s) (ADD) and command signals(s) (CMD) provided to the MRAM device 4520 via one or more bus(es). Data DQ may also be communicated between the memory controller 4510 and MRAM device 4520 via one or more of the bus(es).

The MRAM device 4520 may be an MRAM device according to an embodiment of the inventive concept and include a source line voltage generator.

Figure 26:
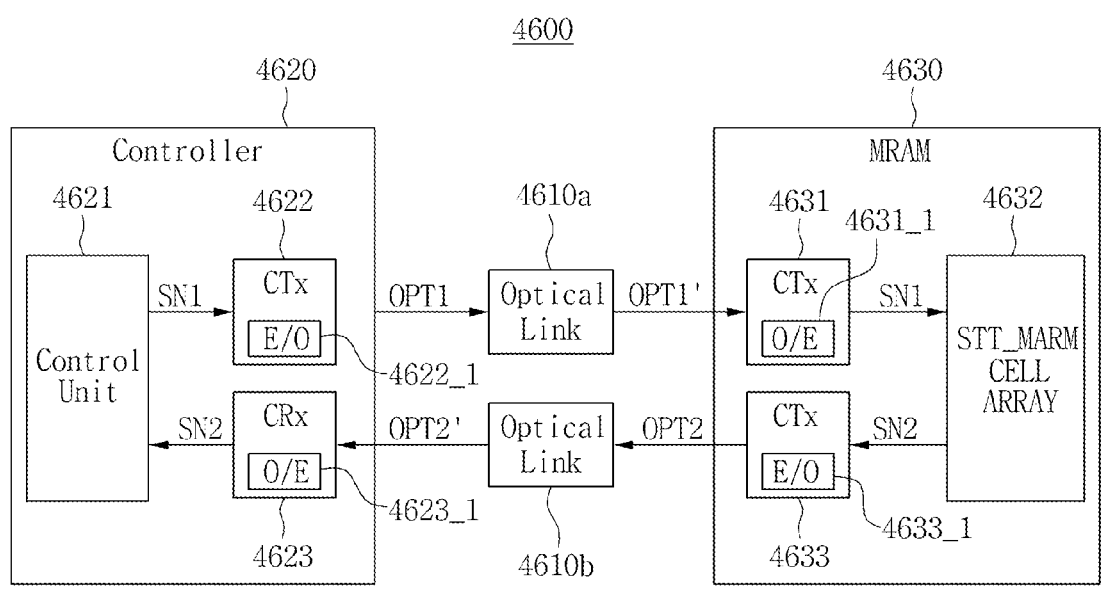
FIG. 26 is a block diagram illustrating a memory device that may include an MRAM device and an optical link according to an embodiment of the inventive concept.

FIG. 26 is a block diagram illustrating a memory system 4600 including an MRAM device and an optical link according to an embodiment of the inventive concept.

Referring to FIG. 26, the memory system 4600 may include a controller 4620, an MRAM device 4630, and a plurality of optical links 4610a and 4610b configured to interconnect the controller 4620 and the MRAM device 4630. The controller 4620 may include a control unit 4621, a first transmitter 4622, and a first receiver 4623. The control unit 4621 may transmit a control signal SN1 to the first transmitter 4622.

The first transmitter 4622 may include a first optical modulator 4622_1, which may convert the control signal SN1, which is an electric signal, into a first optical transmission signal OPT1, and transmit the first optical transmission signal OPT1 to the optical link 4610a.

The first receiver 4623 may include a first optical demodulator 4623_1, which may convert a second optical receiving signal OPT2' received from the optical link 4610b into a data signal SN2, which is an electric signal, and transmit the data signal SN2 to the control unit 4621.

The MRAM device 4630 may include a second receiver 4631, a memory cell array 4632, and a second transmitter 4633. The second receiver 4631 may include a second optical modulator 4631_1, which may convert a first optical receiving signal OPT1' received from the optical link 4610A into the control signal SN1, which is the electric signal, and transmit the control signal SN1 to the memory cell array 4632.

In the memory cell array 4632, data may be written under the control of the control signal SN1, or the data signal SN2 output by the memory cell array 4632 may be transmitted to the second transmitter 4633.

The second transmitter 4633 may include a second optical modulator 4633_1, which may convert the data signal SN2, which is the electric signal, into a second optical data signal OPT2, and transmit the second optical data signal OPT2 to the optical link 4610b.

Figure 27:
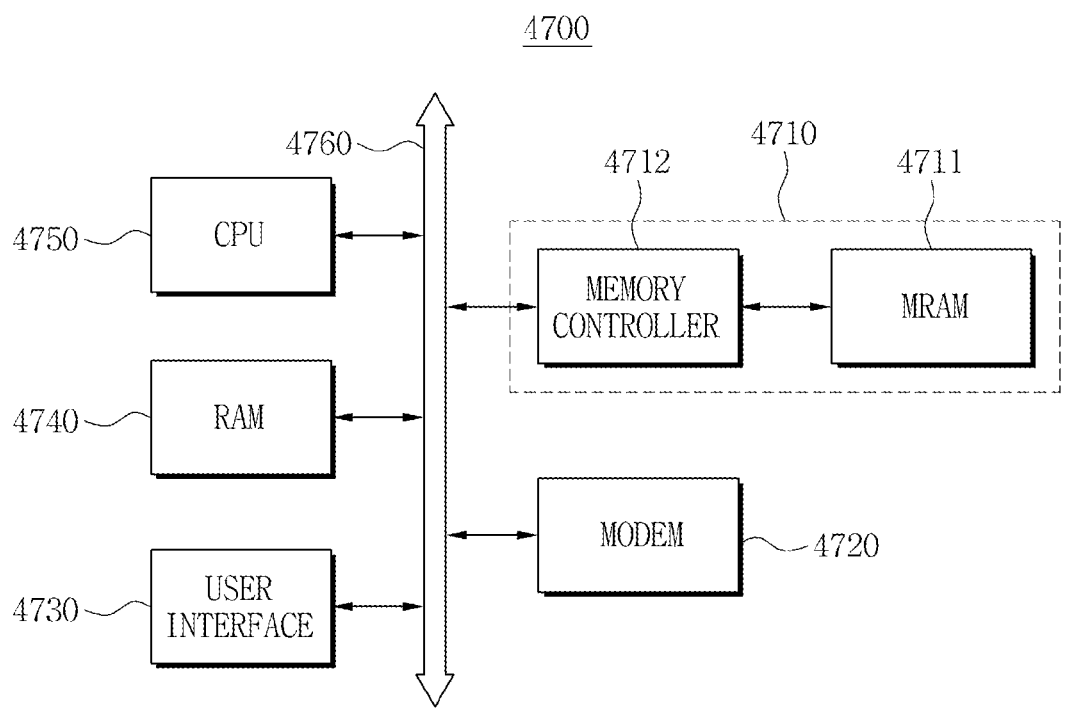
FIG. 27 is a block diagram illustrating an information processing system that may include an MRAM device according to an embodiment of the inventive concept.

FIG. 27 is a block diagram illustrating an information processing system including an MRAM device according to an embodiment of the inventive concept.

Referring to FIG. 27, an MRAM device 4711 may be mounted in a computer system, such as a mobile device or a desktop computer. The information processing system 4700 may include a resistive memory system 4710, a modem 4720, a central processing unit (CPU) 4750, a RAM 4740, and a user interface 4730, which may be electrically connected to a system bus 4760.

The resistive memory system 4710 may include the MRAM device 4711 and a memory controller 4712. Data processed by the CPU 4750 or externally input data may be stored in the MRAM device 4711.

At least one of the MRAM device 4711 or the RAM 4740 may be applied to a semiconductor memory device including MRAM cells. That is, a semiconductor memory device including STT-MRAM cells may be applied to the MRAM device 4711 configured to store a large capacity of data required for the information processing system 4700, or the RAM 4740 configured to store data (i.e., system data) that needs to be rapidly accessed. Although not shown in FIG. 27, it would be apparent to those of ordinary skill in the art that an application chipset, a camera image processor (CIP), and an input/output (I/O) device may be further provided in the information processing system 4700.

Figure 28:
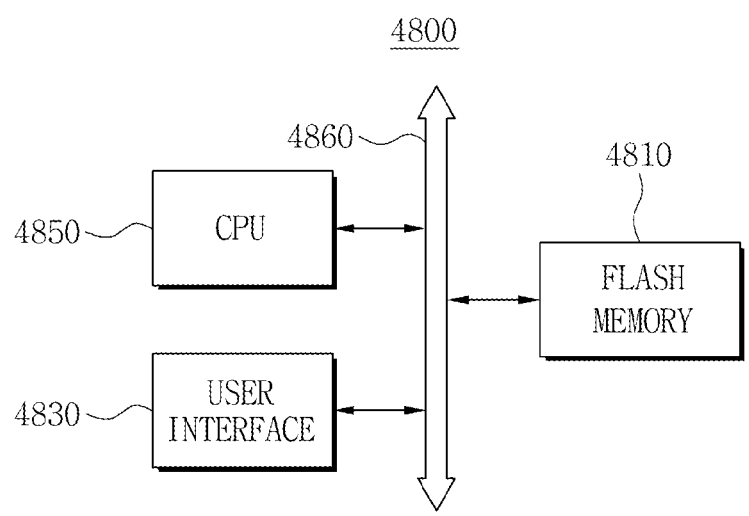
FIG. 28 is a block diagram of an information processing system that may include an MRAM device according to an embodiment of the inventive concept.

FIG. 28 is a block diagram illustrating another information processing system including an MRAM device according to an embodiment of the inventive concept.

Referring to FIG. 28, an MRAM device 4810 including STT-MRAM cells may be mounted in a computer system 4800, such as a mobile device or a desktop computer. The computer system 4800 may include an MRAM device 4810, a CPU 4850, and a user interface 4830, which may be electrically connected to a system bus 4860.

An STT-MRAM may be an advanced memory that may satisfy low-cost large-capacity characteristics of a dynamic RAM (DRAM), operation speed of a static RAM (SRAM), and non-volatile characteristics of a flash memory. Accordingly, while a conventional system requiring an additional cache memory with high processing speed and additional mass storage (e.g., a RAM) configured to store a large capacity of data, the cache memory and the mass storage may be replaced by an MRAM device according to an embodiment of the inventive concept. That is, since a memory device including an MRAM may rapidly store a large capacity of data, a computer system may be configured more simply than in the conventional art.

The inventive concept may be applied to a semiconductor device, particularly, an MRAM device and a memory system including the same.

MRAM devices according to embodiments of the inventive concept include a source line voltage generator configured to generate a source line driving voltage in response to an external power supply voltage, such that a number of pads required to connect an external apparatus to the MRAM may be reduced. Some or all of circuit blocks constituting the source line voltage generator may be disabled during the standby and/or power-down modes. MRAM devices according to embodiments of the inventive concept including a source line voltage generator are able to control the magnitude of a source line driving voltage. Further, one or more source line voltage generator(s) may be separately disposed in relation to a plurality of memory banks in order to reduce source line noise levels.

MRAM devices according to embodiments of the inventive concept are able to apply power gating to circuit blocks, such as a column decoder, thereby reducing power consumption. In addition, MRAM devices according to embodiments of the inventive concept may include an internal voltage generating circuit configured to supply an internal voltage to circuit blocks included in the MRAM device.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A magneto-resistive random access memory (MRAM) device comprising:
    a memory cell array including a plurality of spin-transfer torque magnetic random access memory (STT-MRAM) cells and a source line commonly connected to the plurality of STT-MRAM cells, the memory cell array being configured to operate in response to a word line driving signal and a column selection signal;
    an address input buffer configured to generate a row address and a column address based on an external address;
    a row decoder configured to decode the row address and generate the word line driving signal based on the decoded row address;
    a column decoder configured to decode the column address and generate the column selection signal based on the decoded column address; and
    a source line voltage generator configured to generate a source line driving voltage in response to an external power supply voltage and provide the source line driving voltage to the source line,
    wherein the memory cell array, the row decoder, the column decoder and the source line voltage generator are located on a same semiconductor chip, and
    wherein the memory cell array includes at least two memory banks on the semiconductor chip, and the source line voltage generator is at least partially located between two of the at least two memory banks.

2. The device of claim 1, wherein at least one of a plurality of circuit blocks constituting the source line voltage generator is disabled during at least one of a standby mode and a power-down mode.

3. The device of claim 2, wherein the at least one of the plurality of circuit blocks is disabled in response to a mode register set (MRS) signal.

4. A magneto-resistive random access memory (MRAM) device comprising:
    a memory cell array including a plurality of spin-transfer torque magnetic random access memory (STT-MRAM) cells and a source line commonly connected to the plurality of STT-MRAM cells, the memory cell array being configured to operate in response to a word line driving signal and a column selection signal;
    an address input buffer configured to generate a row address and a column address based on an external address;
    a row decoder configured to decode the row address and generate the word line driving signal based on the decoded row address;
    a column decoder configured to decode the column address and generate the column selection signal based on the decoded column address; and
    a source line voltage generator configured to generate a source line driving voltage in response to an external power supply voltage and provide the source line driving voltage to the source line,
    wherein the source line voltage generator comprises:
    a reference voltage generator configured to generate an up limit and a down limit;
    a differential amplifier configured to feedback a source line voltage, amplify a difference between the source line voltage and the up limit to generate a first voltage signal, and amplify a difference between the source line voltage and the down limit to generate a second voltage signal; and
    a source line driver configured to generate the source line voltage in response to the first voltage signal and the second voltage signal.

5. The device of claim 4, wherein the differential amplifier is disabled in response to an MRS signal.

6. The device of claim 4, wherein the source line driver is disabled during at least one of a standby mode and a power-down mode.

7. The device of claim 6, wherein the source line driver is disabled in response to an MRS signal.

8. The device of claim 7, wherein the source line driver comprises:
    a plurality of drivers connected in parallel, wherein drivers in the plurality of drivers are selectively disabled in response to an MRS signal.

9. The device of claim 4, wherein the source line driver comprises:
    a plurality of first circuits connected in parallel between at least one output node of the differential amplifier and an output node of the source line driver, wherein each one of the plurality of first circuits comprises a driver connected to a fuse.

10. The device of claim 4, wherein the source line driver comprises:
    a plurality of first circuits connected in parallel between at least one output node of the differential amplifier and an output node of the source line driver, wherein each one of the plurality of first circuits comprises a driver series connected to an option metal.

11. The device of claim 10, wherein the option metal in each one of the plurality of first circuits is selectively provided during fabrication of MRAM, such that the absence of an option metal cuts off the corresponding driver from the output node of the source line driver.

12. The device of claim 1, wherein the column decoder comprises:
    a decoding unit configured to decode the column address and generate the decoded column address; and
    a power gating unit configured to perform a power gating operation on the decoded column address and generate the column selection signal.

13. The device of claim 1, wherein the semiconductor chip comprises a source line pad configured to apply an external voltage to the source line.

14. The device of claim 1, further comprising an internal voltage generating circuit configured to generate an internal voltage in response to an external voltage and provide the internal voltage to the memory cell array.

15. The device of claim 1, wherein the MRAM is a stacked memory device in which a plurality of semiconductor layers configured to communicate data and control signals through at least one through-silicon via (TSV).

16. A magneto-resistive random access memory (MRAM) device comprising:
    a memory cell array including a plurality of spin-torque transfer magnetic random access memory (STT-MRAM) cells commonly connected to a source line, wherein the memory cell array is laid out on a substrate in a plurality of banks, and each one of the plurality of STT-MRAM cells is configured to operate in response to a word line driving signal and a column selection signal;
    a row decoder configured to decode a row address and generate the word line driving signal based on the decoded row address;
    a column decoder configured to decode a column address and generate the column selection signal based on the decoded column address; and a source line voltage generator configured to supply a source line driving voltage to the source line, wherein the source line voltage generator is disposed on the substrate and is at least partially interposed among the plurality of banks.

17. The device of claim 16, wherein the row decoder is disposed on the substrate between a first bank and a second bank among the plurality of banks, wherein the first bank and the second bank are adjacent to one another in a word line direction.

18. The device of claim 17, wherein the row decoder comprises a first row decoder providing a first word line driving signal to the first bank and a second row decoder providing a second word line driving signal to the second bank, the first row decoder and the second row decoder being adjacently disposed between the first bank and the second bank.

19. The device of claim 17, wherein the column decoder is disposed on the substrate between the first bank and a third bank among the plurality of banks, wherein the first bank and the third bank are adjacent to one another in a bit line direction.

20. The device of claim 19, wherein the column decoder comprises a first column decoder providing a first column selection signal to the first bank and a second column decoder providing a second column selection signal to the third bank, the first column decoder and the second column decoder being disposed between the first bank and the third bank.

21. The device of claim 20, wherein the source line voltage generator is disposed in the substrate between the first column decoder and the second column decoder.

22. A memory system comprising:
a memory controller configured to generate an address and control signals controlling operation of a magneto-resistive random access memory (MRAM) device, wherein the MRAM comprises:
a memory cell array including a plurality of spin-transfer torque magnetic random access memory (STT-MRAM) cells and a source line commonly connected to the plurality of STT-MRAM cells, the memory cell array being configured to operate in response to a word line driving signal and a column selection signal;
an address input buffer configured to generate a row address and a column address based on an external address;
a row decoder configured to decode the row address and generate the word line driving signal based on the decoded row address;
a column decoder configured to decode the column address and generate the column selection signal based on the decoded column address; and
a source line voltage generator configured to generate a source line driving voltage in response to an external power supply voltage and provide the source line driving voltage to the source line,
wherein the memory cell array, the row decoder, the column decoder and the source line voltage generator are located on a same semiconductor chip, and
wherein the memory cell array includes at least two memory banks on the semiconductor chip, and the source line voltage generator is at least partially located between two of the at least two memory banks.

23. The memory system of claim 22, wherein at least one of a plurality of circuit blocks constituting the source line voltage generator is disabled during at least one of a standby mode and a power-down mode.

* * * * *